United States Patent [19]

Reddy

[11] Patent Number: 5,006,822
[45] Date of Patent: Apr. 9, 1991

[54] HYBRID RF COUPLING DEVICE WITH INTEGRATED CAPACITORS AND RESISTORS

[76] Inventor: Prabhakara Reddy, 7 Sheep Meadow Pl., The Woodlands, Tex. 77381

[21] Appl. No.: 460,355

[22] Filed: Jan. 3, 1990

[51] Int. Cl.$^5$ .......................... H03H 7/48; H05K 1/16
[52] U.S. Cl. .................................. 333/112; 333/119; 333/131; 361/402
[58] Field of Search ............... 333/112, 118, 119, 131, 333/172; 361/402, 404, 406, 311, 321 R, 321 C

[56] References Cited

U.S. PATENT DOCUMENTS

| | | | |
|---|---|---|---|
| 3,714,709 | 2/1973 | Liederbach | 361/402 X |
| 4,130,855 | 12/1978 | Smolko et al. | 361/402 X |
| 4,369,557 | 1/1983 | Vanderbult | 361/402 X |
| 4,437,140 | 3/1984 | Ohyama et al. | 361/402 |

*Primary Examiner*—Paul Gensler
*Attorney, Agent, or Firm*—Wall and Roehrig

[57] ABSTRACT

An RF coupling device is formed on a hybrid printed circuit which avoids discrete capacitors or resistors. The substrate is formed of refractory dielectric sheet, such as alumina or another ceramic. A printed conductor is printed on the front surface of the substrate, and has one or more broadened portions formed on it as capacitor plates. One or more printed resistors are in contact with the printed conductor. A ground pad is printed in a predetermined pattern onto a portion of the reverse surface of the substrate at selected locations. The ground pad has one or more portions that are in registry with the capacitor plates and serve as grounded plates for the capacitors. One or more inductors can be printed onto the substrate in a meander pattern and in contact with the remainder of the printed conductor. The printed circuit receives one or more RF transformers whose leads can be soldered to the printed circuit. RF coupling devices such as a filter, a directional coupler, a two way signal splitter, and a four-way signal splitter can be constructed according to this technique. The capacitors formed as described are generally associated with high Q values which help reduce insertion loss and also increase frequency bandwidth.

10 Claims, 3 Drawing Sheets

HYBRID RF COUPLING DEVICE WITH INTEGRATED CAPACITORS AND RESISTORS

BACKGROUND OF THE INVENTION

This invention relates to RF signal coupling devices, especially those used in a cable TV system, e.g., signal couplers and splitters. The invention is more particularly directed to a device employing alumina substrate on which capacitors and resistors are printed on a ceramic substrate with a ground pad serving as a grounded capacitor plate for the printed capacitors.

A broad-band signal-splitter which can be incorporated into the embodiments of this invention is described in U.S. Pat. No. 4,789,845. Other line splitters or signal splitters are described in U.S. Pat. Nos. 3,454,905; 3,349,345; 3,673,517; and 3,500,252. These devices invariably utilize capacitors, resistors and inductors. In all cases these involve discrete capacitors, resistors, and inductors. These items can be expensive, and can involve additional labor costs in assembly to the printed circuit board. Also, discrete capacitors and resistors have leads, and these items impose an inductive load on the coupling device, and limit bandwidth.

These signal splitters, directional couplers, and kindred devices are intended for use in a cable TV system, and should have a pass band broad enough to handle the entire band of TV broadcast and cable channels. That is, the device should have a passband from 5 MHz to 1000 MHz.

Typically, the conventional splitter or directional coupler has RF transformers attached onto a printed circuit board with the leads being soldered to a printed conductor that extends through holes in the laminate. A number of discrete capacitors, coils and resistors have to be soldered to the printed conductor on the board, or, just as often, have to be soldered directly onto a lead of the transformer. Consequently, with the conventional device, the pass band becomes somewhat limited, especially at the high end, and the overall performance is unsatisfactory because of stray inductances and capacitances that intensive to produce.

OBJECTS AND SUMMARY OF THE INVENTION

It is an object of this invention to provide a simplified printed circuit RF coupling device that avoids discrete capacitors and resistors.

It is another object to provide an RF coupling device which has a wide pass band and minimal insertion loss.

It is still another object to provide a printed circuit which facilitates automated assembly of a splitter, directional coupler, or other RF device for a cable TV system.

According to an embodiment of this invention, a hybrid circuit for a splitter, directional coupler or other device is formed on a ceramic (i.e., alumina) substrate, which is rigid and refractory to withstand soldering and other heat treatment. A printed conductor is printed onto the front surface of the substrate, and includes one or more broadened areas each of a predetermined dimension, to serve as a capacitor plate. One or more printed resistors can be formed of a resistive material that is printed onto the substrate in contact with the printed conductor. A ground pad is printed in a predetermined pattern onto a portion of the reverse surface of the substrate. This ground pad forms grounded capacitor plates at selected locations on the reverse surface, which positions overlie and are in registry with the positions of the capacitor plates printed on the front surface. These printed plates form the required capacitors, with the substrate itself serving as the dielectric medium. Small inductances, where required, can be formed by conductors printed in a meander pattern on the substrate, either on the front surface or on a portion of the reverse surface not occupied by the ground pad.

RF transformers are attached onto this hybrid printed circuit and their various leads are soldered to conductor pads on the front surface. In the case of a signal splitter, center-tap leads are soldered directly to a printed capacitor plate.

The printed circuit can be applied to the substrate using thin-film or thick-film techniques, or the substrate can be plated and etched.

The above and other objects, features and advantages of this invention will become apparent from the ensuing description of selected preferred embodiments of the invention, which should be read in connection with the accompanying Drawing.

DETAILED DESCRIPTION OF THE PREFERRED EMBODIMENTS

Figure 1:
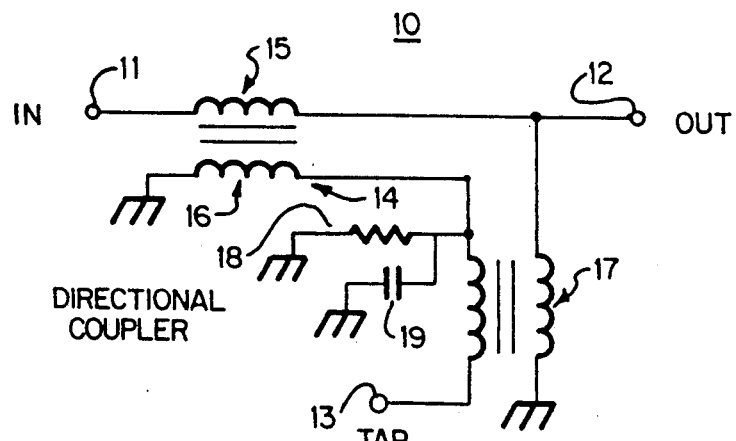
FIGS. 1 to 3 are circuit diagrams of RF coupling devices, namely a directional coupler, a two-way signal splitter, and a four-way signal splitter, respectively.

With reference to the Drawing, FIG. 1 is a circuit diagram of a directional coupler 10 which can be employed, e.g. in a cable TV system, and has an input terminal 11 and an output terminal 12, and a tap or secondary output terminal 13. These terminals are typically connected to the center conductors of TV cable system coaxial cables, whose braids are connected to ground. Transformer 14 has a primary winding 15 with one end connected to the input terminal 11 and the other end connected to output terminal 12. A secondary winding 16 has one end coupled to ground, and another end connected to ground through a resistor 18 and through a capacitor 19 in parallel to resistor 18. The primary winding of a second transformer 17 has one end connected to the output terminal 12 and the other end connected to ground. The secondary winding of the transformer 17 has one end connected to ground through resistor 18 and through capacitor 19 in parallel to resistor 18, and the other end connected to the secondary output terminal 13. The various coils, resistor, and capacitor can be selected to suitable values for the frequencies and bandwidths needed.

Figure 2:
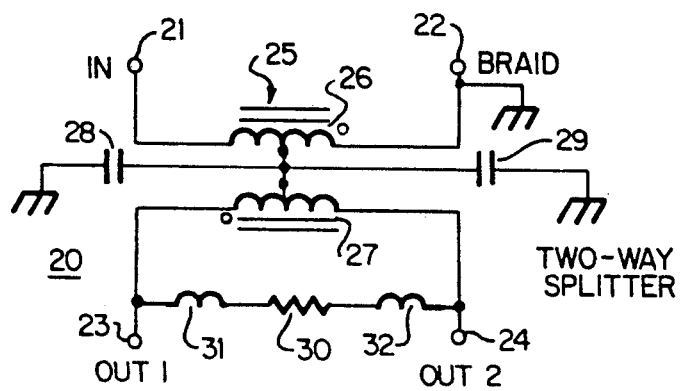

A two-way signal splitter 20 is shown in the diagram of FIG. 2. Here, there are input terminal 21 and a ground terminal 22 connected respectively to the center conductor and braid of a coaxial cable, and a pair of output terminals 23 and 24 which pass the signal in balanced form to center conductors of respective coaxial cables. An autotransformer 25 has its winding 26 connected between the terminals 21 and 22, and another autotransformer has its winding 27 connected to the output terminals 23 and 24. Center tap of the coil 27 and a selected tap from coil 26 are joined together, and are connected to ground through a pair of capacitors 28 and 29. A series circuit formed of a resistor 30 and a pair of small inductances 31 and 32 is connected between the two output terminals 23 and 24. Again, this basic design for a signal splitter is well known, and the values of the various components can be selected as appropriate for the required frequencies and bandwidths.

Figure 3:
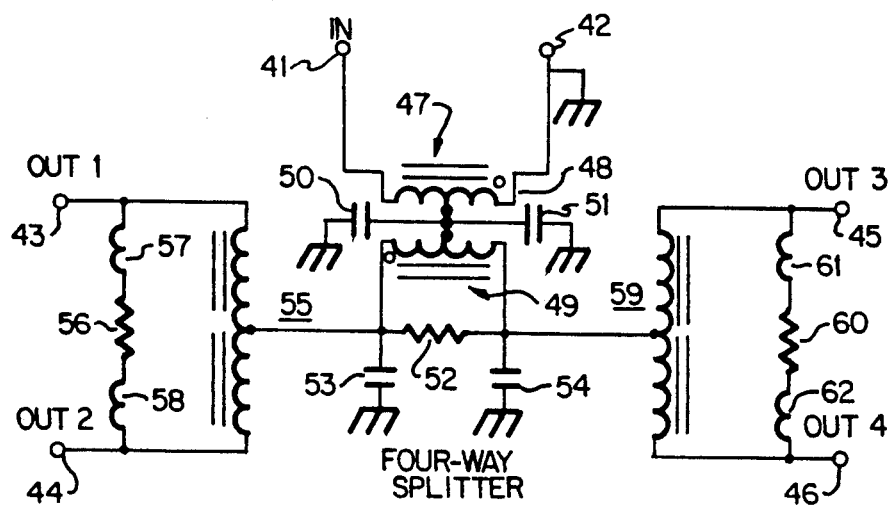

A four-way signal splitter 40 is shown in the diagram of FIG. 3. Here there is a signal input 41, a ground terminal 42, and first through fourth output terminals 43, 44, 45, and 46. An autotransformer 47 has its winding 48 connected between the terminals 41 and 42, and a second autotransformer 49 has its center tap joined to the selected tap of the winding 48. The junction of the two taps is coupled through a pair of capacitors 50 and 51 to ground. A resistance 52 is connected between the output leads of the second autotransformer 49, and these leads are also connected to ground through respective capacitors 53 and 54. One side of the winding 49 then feeds a center tap of an autotransformer 55, which splits the signal between the first and second outputs 43 and 44. A series circuit comprised of a resistor 56 and a pair of small inductances 57 and 58 is situated between the output terminals 43 and 44. Similarly, the other side of the autotransformer 49 leads to a center tap of an autotransformer 59, which splits the signal between output terminals 45 and 46. A series circuit formed of a resistance 60 and small inductances 61 and 62 extends between the output terminals 45 and 46.

Each of the RF coupling devices as diagrammed in FIGS. 1, 2, and 3 and as described above employs a number of inductive, capacitive, and resistive components, which can increase the insertion loss. Also, because of the number of components employed, the devices described above can be difficult to construct, and can require delicate and labor-intensive manufacturing techniques if discrete capacitor and resistor components are used.

Figure 4:
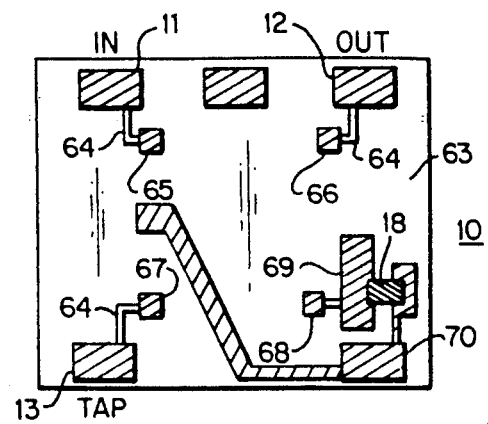
FIGS. 4 and 5 are a top plan view and a reverse plan view of a hybrid integrated printed circuit for the directional coupler of FIG. 1, constructed according to an embodiment of this invention.
Figure 5:
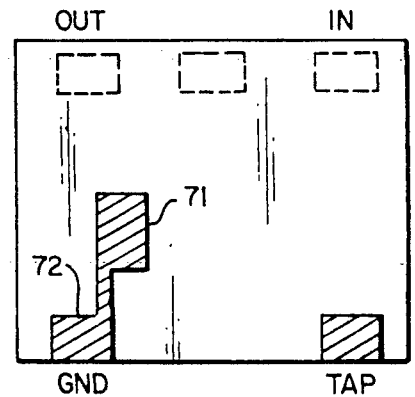
Figure 6:
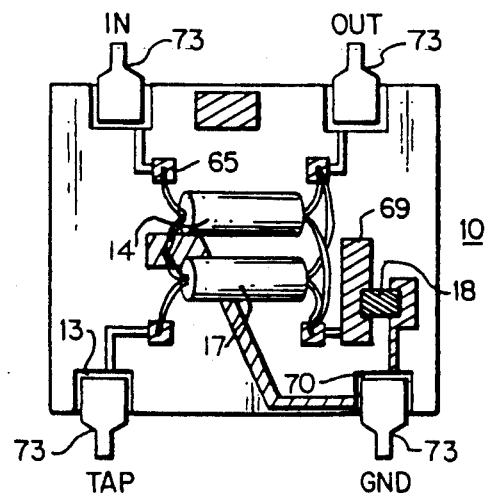
FIG. 6 is a top plan view of an assembled directional coupler according to this embodiment of the invention.

A hybrid integrated printed circuit according to this invention, and which is embodied as the directional coupler as FIG. 1, is shown in FIGS. 4-6. In this case, the directional coupler 10 is formed on a rigid ceramic substrate 63, with the input terminal 11, output terminal 12, and tap 13 printed thereon. Printed conductors or leads 64 connect these terminals to connecting pads 65, 66, and 67 respectively, while another connecting pad 68 is connected to a metallized rectangular area 69 which forms one plate of the capacitor 19. The resistor 18 is printed employing a resistive ink technique, or another thick film or thin film technique. The printed resistor 18 extends from the metallized area 69 to a ground terminal 70. The reverse side of the substrate 63, as shown in FIG. 5, has a metallized ground pad 71 which is in registry with the rectangular metallized area 69, and forms the grounded plate of the capacitor 19. This is connected to a ground terminal 72 which is in registry with the ground terminal 70 that is on the front side of the substrate. As shown in FIG. 6, the directional coupler is constructed simply by connecting metal terminal clips 73 onto the terminals 11, 12, 13, and 70, and then dip-soldering to secure them in place. The autotransformers 14 and 17 are connected by coupling the leads thereof to the respective connecting pads 65, 66, 67, and 68. It should be appreciated that these steps can be easily automated, and that discrete capacitive and resistive components are eliminated.

Figure 7:
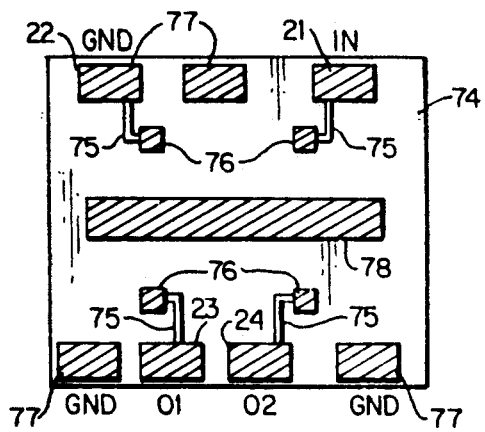
FIGS. 7 and 8 are a top plan view and a reverse plan view of a hybrid integrated printed circuit for the two-way splitter of FIG. 2, constructed according to an embodiment of this invention.
Figure 8:
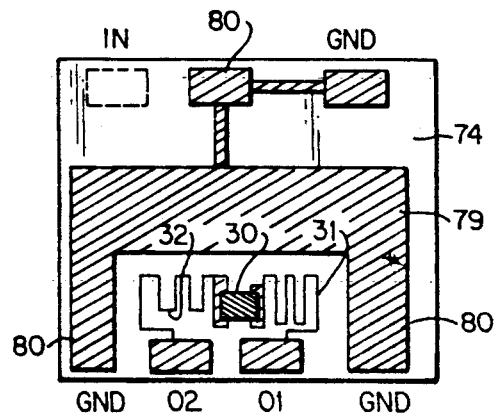
Figure 9:
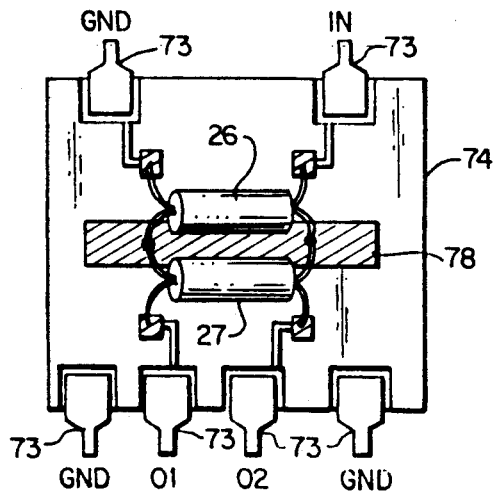
FIG. 9 is a top plan view of an assembled two-way splitter according to this embodiment of the invention.

A hybrid integrated two-way splitter can be embodied as shown in FIGS. 7-9. As shown in FIG. 7, a rigid ceramic substrate 74 has metallized conductors 75 printed thereon extending between autotransformer connecting pads 76 and terminals 21, 22, 23, and 24. There are also various ground terminals 77 printed thereon. A metallized rectangular area 78 is printed transversely thereon between an input side which contains the terminals 21 and 22, and an output side which contains the terminals 23 and 24. As shown in FIG. 8, the reverse side of the substrate 74 has a metallized ground pad 79 printed thereon with a major portion thereof overlying and in registry with the metallized rectangular area 78. The metallized area 78 and ground pad 79 respectively form the signal and ground plates of the two capacitors 28 and 29, as shown in FIG. 2. There are also leg portions 80 that extend from the ground pad 79 to edges of the substrate where the leg portions 80 are in registry with the various ground terminals 77.

A cutout or unmetallized area is defined on one side of the substrate between two of the legs 80 and below the pad 79. In this cutout area there is printed the resistor 30 and printed inductors 31 and 32. The inductors are printed of conductive material in meander fashion from the printed resistor 30 to respective conductive pads that are in registry with the terminal pads 23 and 24.

The two-way signal splitter is assembled in the form shown in FIG. 9 by connecting and dip-soldering metal terminal clips 73 onto the various terminals 21, 22, 23, 24, and 77, and soldering the leads of the autotransformers 26 and 27 to the pads 76, with the tap twisted leads being soldered directly to the metallized rectangular area 78.

Figure 10:
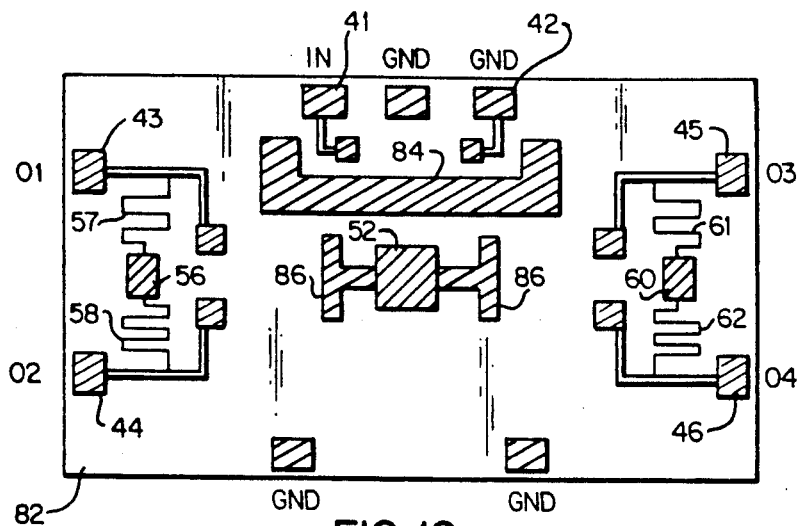
FIGS. 10 and 11 are a top plan view and a reverse plan view of a hybrid integrated printed circuit for the four-way splitter of FIG. 3, constructed according to an embodiment of this invention.
Figure 11:
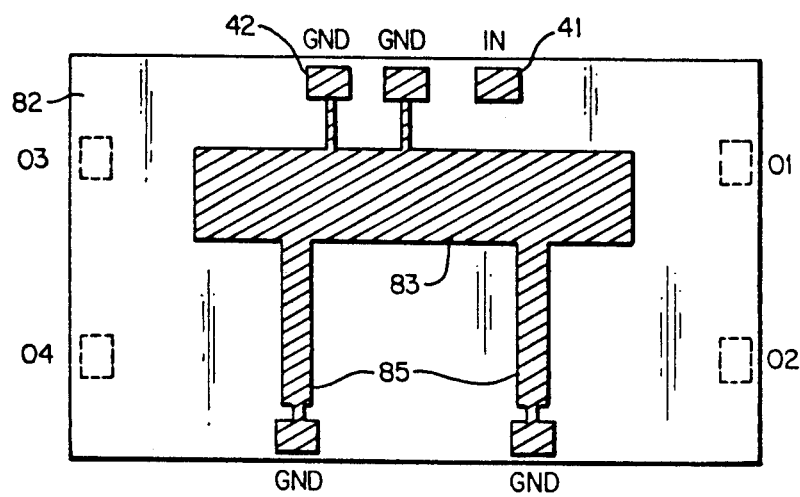
Figure 12:
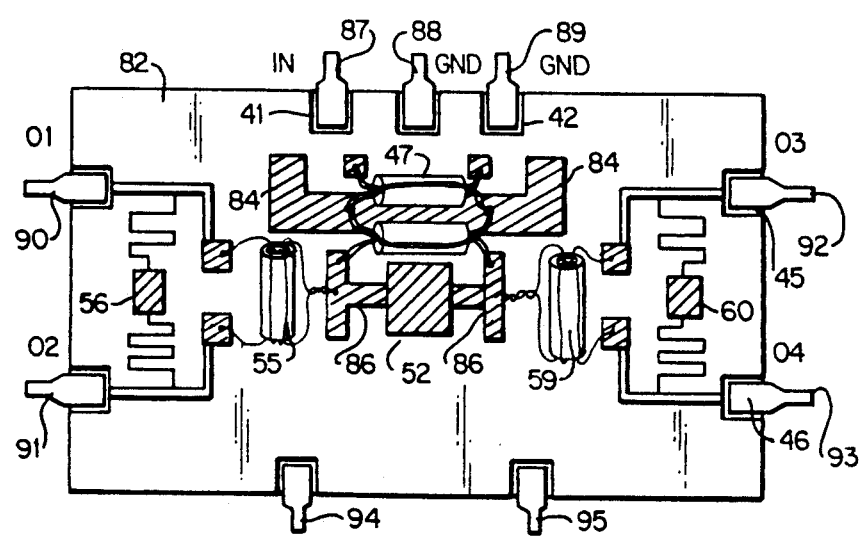
FIG. 12 is a top plan view of an assembled four-way splitter according to this embodiment of the invention.

The four-way signal splitter 40 constructed to embody this invention is shown in FIGS. 10, 11, and 12. Here, the resistors 52, 56, and 60, as required in the diagram of FIG. 3, are formed as printed resistors while the small inductances 57, 58, 61, and 62 are formed as printed conductive meanders that join the printed resistors 56 and 60 to the output terminals 43, 44, and 45, 46 respectively. A ground pad 83, which is formed on a selected portion of the reverse side of the substrate 82 forms the grounded plates of the capacitors 50 and 51. A conductive area 84 on the front side of the substrate 82 and in registry with the ground pad 83 forms the plates of these capacitors 50 and 51 to which the taps of the autotransformers 47 and 49 are soldered. A pair of printed conductive legs 85 extend downwardly from the ground plate 83 to an edge of the substrate 82, and a pair of conductive areas 86 are printed on the front surface of the substrate 82 in registry with these legs 85. These conductive areas 86 together with the legs 85 form the capacitors 53 and 54 which couple the winding of the autotransformer 49 to ground.

As shown in FIG. 12, this device is assembled by soldering the leads of the autotransformers 47, 49, 55, and 59 to appropriate conductive pads on the front side of the substrate 82, and then clamping and dip soldering terminal pins 87-95 to the various input output and ground terminals as shown. All components other than the autotransformers and the connecting pins are printed onto the substrate 82, so that discrete capacitors, discrete resistors, and discrete small inductors are avoided.

With any of the devices constructed as shown and as described, fabrication can easily be automated. The only parts to be soldered are the autotransformers and the connector pins. With these devices, the insertion loss is kept as low as possible, because stray inductance and stray capacitance are avoided. Substrate thickness and substrate dielectric constant can be selected and controlled, as can be the area of the various printed capacitors. Thus, the capacitors required can be formed to very narrow tolerances and to high Q values, so that balance is very easily accomplished. In addition, the resistors 18, 30, 52, 56, and 60 can have values within very small tolerances as well. Either a thick-film or a thin-film technique can be employed in forming these printed circuits. Also, some of the components can be printed on the reverse rather than the front side of the substrate, as determined by design and space requirements.

While the invention has been described in detail with respect to certain preferred embodiments, it should be recognized that the invention is not limited to those precise embodiments. Rather, many modifications and variations would present themselves to those skilled in the art without departing from the scope and spirit of this invention as described in the appended claims.

What is claimed is:

1. A hybrid integrated circuit without discrete capacitors or resistors comprising
   a substrate formed of a refractory dielectric sheet having a front surface and a reverse surface;
   printed conductors printed on the front surface of the substrate and having one or more broadened portions formed thereon of predetermined area to serve as capacitor plates;
   one or more printed resistors formed of a resistive material printed onto said substrate in contact with said printed conductors; and
   a conductive ground pad printed in a predetermined pattern onto a portion of the reverse surface of said substrate at selected locations thereon and having one or more broadened portions in registry with the broadened portions of the printed conductor to serve as a grounded capacitor plate and leaving at least one substantially open space on said reverse surface not occupied by said grounded capacitor plate.

2. A hybrid printed circuit according to claim 1 further comprising one or more printed inductors printed onto said substrate in a meander pattern and in contact with said printed conductors.

3. A hybrid printed circuit according to claim 2 wherein said one or more printed inductors are printed onto the reverse surface of said substrate in said space not occupied by said grounded capacitor plate.

4. A hybrid integrated circuit without discrete capacitor or resistor comprising
   a substrate formed of a refractory dielectric sheet having a front surface and a reverse surface;
   printed conductors on the front surface of the substrate and having one or more broadened portions formed thereon of predetermined area to serve as capacitor plates;
   one or more printed resistors formed of a resistive material printed onto said substrate in contact with said printed conductors;
   a conductive ground pad printed in a predetermined pattern onto a portion of the reverse surface of said substrate at selected locations thereon and having one or more broadened portions in registry with the broadened portions of the printed conductor to serve as a grounded capacitor plate; and
   a signal transformer arrangement having first through fourth leads soldered to predetermined first through fourth conductor locations on said printed conductor.

5. A hybrid printed circuit according to claim 4 wherein said transformer arrangement has a fifth lead serving as a tap of the windings thereof, said fifth lead being soldered to one of said broadened capacitor plate portions of said printed conductor.

6. An RF coupling device having an input terminal and a plurality of output terminals including a transformer arrangement that has at least an input signal terminal lead, a ground terminal lead, and a pair of output terminal leads, and a hybrid integrated printed circuit onto which said transformer arrangement is mounted, said printed circuit board including a refractory substrate in the form of a sheet of a dielectric material having a front surface and a reverse surface, printed conductors printed of a conductive material in a predetermined pattern on the front surface of the substrate and including conductive pads onto which the leads of said transformer arrangement are soldered, input and output terminals, conductive paths connecting the input and output terminals with said conductive pads, at least one printed resistor printed onto said substrate in circuit with one of said printed conductive paths a printed capacitor plate printed onto the front side of said substrate in electrical contact with at least one lead of said transformer arrangement, and at least one conductive ground pad printed in a predetermined pattern on the reverse surface of said substrate, said ground pad being in registry with the position of said printed capacitor plate to serve as a grounded capacitor plate, whereby all required capacitors and resistors are integrated onto the printed circuit to reduce signal insertion loss and increase usable bandwidth.

7. An RF coupling device according to claim 6 wherein said transformer arrangement has a pair of intermediate-tap leads, and such leads are soldered to a rectangular printed capacitor plate on the front surface of the substrate.

8. An RF coupling device according to claim 6, wherein a circuit path is printed on said board to connect a pair of output terminals including first and second printed inductors connected to respective output terminals and each printed of conductive material in a meander pattern, and a printed resistance joining the first and second printed inductors.

9. An RF coupling device according to claim 8 wherein said circuit path is printed onto the reverse side of said substrate in a space not occupied by said ground pad.

10. An RF coupling device according to claim 6 wherein said substrate is a ceramic material.

* * * * *